United States Patent
Lee et al.

(10) Patent No.: US 10,697,073 B2
(45) Date of Patent: Jun. 30, 2020

(54) METHOD FOR MANUFACTURING ELECTRODE FOR HYDROGEN PRODUCTION USING TUNGSTEN CARBIDE NANOFLAKE AND ELECTRODE FOR HYDROGEN PRODUCTION MANUFACTURED THEREBY

(71) Applicant: KOREA INSTITUTE OF SCIENCE AND TECHNOLOGY, Seoul (KR)

(72) Inventors: Wook Seong Lee, Seoul (KR); Young-Jin Ko, Seoul (KR); Young Joon Baik, Seoul (KR); Jong-Keuk Park, Seoul (KR); Kyeong Seok Lee, Seoul (KR); Inho Kim, Seoul (KR); Doo Seok Jeong, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 38 days.

(21) Appl. No.: 15/608,082

(22) Filed: May 30, 2017

(65) Prior Publication Data

US 2018/0038003 A1 Feb. 8, 2018

(30) Foreign Application Priority Data

Aug. 8, 2016 (KR) .................. 10-2016-0100552

(51) Int. Cl.
*C25B 11/04* (2006.01)
*C23C 16/56* (2006.01)
(Continued)

(52) U.S. Cl.
CPC .......... *C25B 11/0415* (2013.01); *C23C 16/32* (2013.01); *C23C 16/503* (2013.01);
(Continued)

(58) Field of Classification Search
None
See application file for complete search history.

(56) References Cited

U.S. PATENT DOCUMENTS 3,508,320 A * 4/1970 Blue ................. C22C 1/0466
29/875
3,737,344 A * 6/1973 Benda et al. .......... H01M 4/90
205/704
(Continued)

FOREIGN PATENT DOCUMENTS

KR     100687729 B1    2/2007
KR   1020120130184 A  11/2012
(Continued)

OTHER PUBLICATIONS

Xiao, P et al. "Novel Molybdenum Carbide-Tungsten Carbide Nanowire and Their Electrochemical Activation for Efficient and Stable Hydrogen Evolution" Advanced Functional Materials, 2015, 25, p. 1520-1526. (Year: 2015).*

(Continued)

*Primary Examiner* — Brian W Cohen
(74) *Attorney, Agent, or Firm* — Cantor Colburn LLP (57) ABSTRACT

A method for manufacturing an electrode for hydrogen production using a tungsten carbide nanoflake may include: forming a tungsten carbide nanoflake on a nanocrystalline diamond film by means of a chemical vapor deposition process in which hydrogen plasma is applied; and increasing activity of the tungsten carbide nanoflake to a hydrogen evolution reaction by removing an oxide layer or a graphene layer from a surface of the tungsten carbide nanoflake. Since an oxide layer and/or a graphene layer of a surface of tungsten carbide is removed by means of cyclic cleaning after tungsten carbide is formed, hydrogen evolution reaction (HER) activity of the tungsten carbide may be (Continued)

increased, thereby enhancing utilization as a catalyst electrode.

7 Claims, 9 Drawing Sheets

(51) Int. Cl.
  *C23C 16/503* (2006.01)
  *C23C 16/32* (2006.01)
  *C25B 11/02* (2006.01)
  *B82Y 30/00* (2011.01)
  *B82Y 40/00* (2011.01)
(52) U.S. Cl.
  CPC .............. *C23C 16/56* (2013.01); *C25B 11/02* (2013.01); *C25B 11/0447* (2013.01); *B82Y 30/00* (2013.01); *B82Y 40/00* (2013.01); *Y02E 60/366* (2013.01)

(56) References Cited

U.S. PATENT DOCUMENTS

| | | | | |
|---|---|---|---|---|
| 4,473,454 | A | * | 9/1984 | Asano ................ C25B 11/0489 204/290.06 |
| 9,175,387 | B2 | | 11/2015 | Lee et al. |
| 2006/0180464 | A1 | * | 8/2006 | Griffin .................... C25B 1/04 204/280 |
| 2013/0273395 | A1 | * | 10/2013 | Lee ......................... C23C 16/32 428/698 |
| 2013/0302592 | A1 | | 11/2013 | Lee et al. |
| 2014/0371052 | A1 | | 12/2014 | Wang et al. |

FOREIGN PATENT DOCUMENTS

| | | |
|---|---|---|
| KR | 101313753 B1 | 10/2013 |
| KR | 1020130115847 A | 10/2013 |
| WO | 20110895522 A3 | 7/2011 |

OTHER PUBLICATIONS

Electrochimica Acta vol. 31, Issue 1, Jan. 1986, pp. 103-111 "The mechanism of the activation process of the tungsten carbide electrode" Author: P. Zoltowski (Year: 1986).*
Falk Harnisch et al., "Tungsten carbide as electrocatalyst for the hydrogen evolution reaction in pH neutral electrolyte solutions," Applied Catalysis B: Environmental, 2009, pp. 455-458, vol. 89, Elsevier B.V.
D. V. Sokolsky et al., "Electrochemical hydrogen reactions on tungsten carbide," Electrochimica Acta, 1975, pp. 71-77, vol. 20, Pergamon Press, GB.
Lee et al., "Ultrananocrystalline diamond film deposition by direct-current plasma assisted chemical vapor deposition using hydrogen-rich precursor gas in the absence of the positive column", Journal of Applied Physics, 109, 2011, pp. 023303.

* cited by examiner

NANOWALL BEFORE CLEANING

FIG. 4B

NANOWALL AFTER CLEANING

FIG. 4C

NANOCRYSTAL BEFORE CLEANING

FIG. 4D

NANOCRYSTAL AFTER CLEANING

METHOD FOR MANUFACTURING ELECTRODE FOR HYDROGEN PRODUCTION USING TUNGSTEN CARBIDE NANOFLAKE AND ELECTRODE FOR HYDROGEN PRODUCTION MANUFACTURED THEREBY

CROSS-REFERENCE TO RELATED APPLICATION

This application claims priority to Korean Patent Application No. 10-2016-0100552, filed on Aug. 8, 2016, and all the benefits accruing therefrom under 35 U.S.C. § 119, the contents of which in its entirety are herein incorporated by reference.

BACKGROUND

1. Field

Embodiments relate to a method for manufacturing an electrode for hydrogen production using a tungsten carbide nanoflake, and an electrode for hydrogen production manufactured by the method.

2. Description of the Related Art

Hydrogen molecule ($H_2$) is gathering attention as an energy carrier. As a fuel, hydrogen has a greatest energy density per unit mass and generates only water as a side product. To the contrary, a carbon-based fuel generates carbon dioxide as a side product. In addition, hydrogen is an infinite element on the earth, and thus it is not needed to check its residual amount, different from carbon-based fuels. However, hydrogen is not present alone in nature but is found in a compound, and thus, the technique to produce hydrogen from compounds is of great importance.

In these days, most hydrogen is produced by means of a steam reforming process using fossil fuels. However, carbon dioxide produced by reacting steam with hydrocarbon still causes a problem, and thus researches have been focused on hydrogen production techniques not generating carbon dioxide. Among them, electrolysis of water is a hydrogen production technique which is environmentally clean and reproducible. Electrochemical water separation needs two half-cell reactions, namely hydrogen evolution reaction (HER) and oxygen evolution reaction (OER).

In the HER, platinum serves as a substance with a greatest catalytic activity. However, platinum is one of small-deposit materials, and thus it is difficult to meet the global energy consumptions using platinum. Therefore, it is needed to develop a catalyst electrode using an element which may replace platinum and is also rich on the earth. In particular, the necessary conditions of a heterogeneous catalyst for substituting platinum may include (1) low electrochemical overpotential and (2) stability in operation.

Among many candidate materials, tungsten carbide which is a kind of metal carbides has received great attention, and tungsten carbide is known as being very excellent in thermal and electrochemical stability. In particular, tungsten carbide has a D-band density of state (DOS) similar to platinum and thus is regarded as a candidate for substituting platinum in various electrocatalytic reactions of HER or the like.

However, conventional techniques for composing tungsten carbide mostly causes sintering, and in many cases, a passivating oxide film serving as an insulator in a solution state is formed on a surface on tungsten carbide. In particular, the passivating oxide film is easily formed on the surface of tungsten carbide in an acidic medium. Due to this drawback, it is being studied to modify a surface of tungsten carbide by means of preprocess or nanoparticles on which the passivating oxide film is not easily formed. However, most researches are focused on nanoparticles, and thus there is a problem in long-term stability.

SUMMARY

An aspect of the present disclosure is directed to providing a method for manufacturing an electrode for hydrogen production, which may have an improved hydrogen evolution reaction (HER) by removing an oxide layer and/or a graphene layer on a surface of tungsten carbide by means of cyclic cleaning after forming a tungsten carbide nanoflake as an electrode body, and an electrode for hydrogen production manufactured by the method.

Another aspect of the present disclosure is directed to composing various kinds of nanostructures, particularly tungsten carbide of a nanowall or nanocrystalline structure, by adjusting the degree of passivating oxide film at the growth of tungsten carbide to control an arrangement of the nano structure of tungsten carbide.

A method for manufacturing an electrode for hydrogen production using a tungsten carbide nanoflake according to an embodiment comprises: forming a tungsten carbide nanoflake on a nanocrystalline diamond film by means of a chemical vapor deposition process in which hydrogen plasma is applied; and increasing activity of the tungsten carbide nanoflake to a hydrogen evolution reaction by removing an oxide layer or a graphene layer from a surface of the tungsten carbide nanoflake.

In an embodiment, in the chemical vapor deposition process in which hydrogen plasma is applied, in a state where a substrate having a nanocrystalline diamond film is provided on an anode in a chamber and a surface-carburized tungsten cathode is provided at a location upwardly spaced apart from the substrate, hydrogen plasma is applied into the chamber.

In an embodiment, the step of forming a tungsten carbide nanoflake may include controlling the degree of supersaturation at a growth front of tungsten carbide so that the tungsten carbide grows to have a nanowall structure.

In an embodiment, the step of controlling the degree of supersaturation at a growth front of tungsten carbide may include controlling a flux of growth species by adjusting a process temperature of the chemical vapor deposition process in which hydrogen plasma is applied.

In an embodiment, the step of controlling the degree of supersaturation at a growth front of tungsten carbide may include controlling a flux of growth species by adjusting a discharge voltage and current which is applied for generating hydrogen plasma in the chemical vapor deposition process in which hydrogen plasma is applied.

In an embodiment, the surface-carburized tungsten cathode may have a carbonization layer formed to a predetermined depth from the surface of the tungsten carbide nanoflake by exposing the tungsten cathode to a carbon environment of a predetermined temperature, and the carbonization layer may form a $WC_x$, structure.

In an embodiment, the method for manufacturing an electrode for hydrogen production using a tungsten carbide nanoflake may further include forming a protection film to partially cover the surface of the tungsten carbide nanoflake.

An electrode for hydrogen production using a tungsten carbide nanoflake according to an embodiment comprises:

an electrode body comprising a nanocrystalline diamond film located on a substrate, and a tungsten carbide nanoflake located on the nanocrystalline diamond film; and a protection film configured to partially cover the electrode body.

In an embodiment, the tungsten carbide nanoflake may have a two-dimensional nanostructure (for example, a nanowall or nanocrystalline structure) arranged on the nanocrystalline diamond film.

DETAILED DESCRIPTION

Hereinafter, configurations and features of the present disclosure will be described based on embodiments, but these embodiments just illustrate the present disclosure and do not limit the present disclosure.

Figure 1:
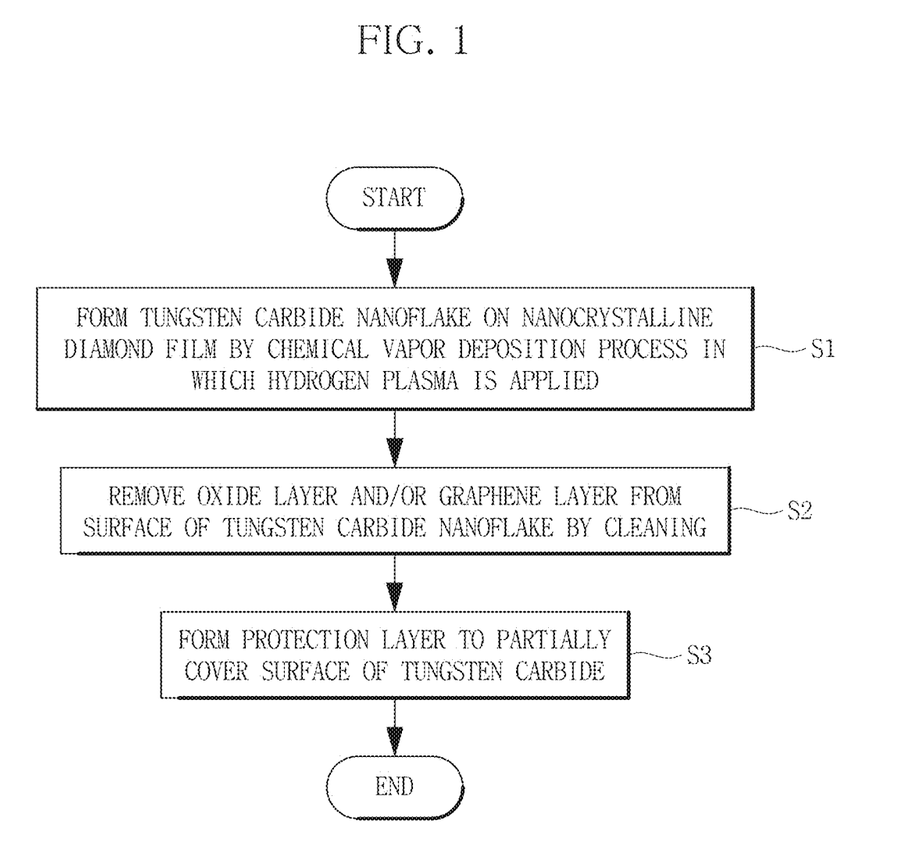
FIG. 1 is a flowchart for illustrating a method for manufacturing an electrode for hydrogen production using a tungsten carbide nanoflake according to an embodiment.

FIG. 1 is a flowchart for illustrating a method for manufacturing an electrode for hydrogen production using a tungsten carbide nanoflake according to an embodiment.

Referring to FIG. 1, a nanoflake of tungsten carbide (WC) may be made on a nanocrystalline diamond (NCD) film by means of a plasma-assisted chemical vapor deposition (PACVD) process in which hydrogen plasma is applied (S1). In an embodiment, a DC-PACVD using a direct current is applied.

More specifically, an anode on which a substrate is placed is provided in a chemical vapor deposition chamber, and a tungsten cathode is provided at a location upwardly spaced apart from the substrate. Since NCD is very stable in the presence of hydrogen atoms or under conditions such as acidic or alkali environments, the NCD is used as a substrate for the growth of tungsten carbide. If a power is applied to the anode and the cathode together with supplying hydrogen into the chamber, hydrogen plasma is generated. At this time, the tungsten cathode and the NCD serve as sources of growth species, namely a source of tungsten atom and a source of carbon atom, respectively. As a result, a nanoflake of tungsten carbide is formed on the NCD film.

In other words, in order to form tungsten carbide of a two-dimensional nanostructure according to embodiments of the present disclosure, 1) a chemical vapor deposition process is required, and also 2) it is required to apply hydrogen plasma during the chemical vapor deposition process.

As described above, in the chemical vapor deposition process, growth species (tungsten atom, carbon atom) is supplied from the tungsten cathode and the NCD to form tungsten carbide of a nanowall structure on the NCD.

In an embodiment, a tungsten carbide nanoflake having a two-dimensional nanostructure is formed. The two-dimensional nanostructure may be a structure where nanoflakes are arranged in a vertical direction with regard to the plane of the substrate, for example a nanowall structure or a nanocrystalline structure.

When forming the tungsten carbide, the NCD film somewhat serves as a source of carbon atom. However, for the growth into a nanowall structure or a nanocrystalline structure with a vertical arrangement, carbon should be supplied on the NCD film. For this purpose, the tungsten cathode needs to employ a surface-carburized tungsten cathode. The surface-carburized tungsten cathode is obtained by carbonizing a tungsten cathode and has a carbonization layer to a predetermined depth from the surface. The carbonization layer is made of $WC_x$ material, and the carbonization layer may be formed by exposing the tungsten cathode to a methane gas environment of a predetermined temperature. The surface-carburized tungsten cathode, or particularly the carbonization layer, serves as a source of tungsten atom and carbon atom when tungsten carbide of a nanowall or nanocrystalline structure is formed.

Meanwhile, in the present disclosure, it is premised that hydrogen plasma is applied during the chemical vapor deposition process. If source plasma is generated at high pressure of 100 Torr or above, hydrogen plasma makes a physicochemical interaction with the surface-carburized tungsten cathode and gives a driving force so that the tungsten atom and the carbon atom move onto the NCD film at the carbonization layer of the tungsten cathode.

Since the hydrogen plasma physically contacts the tungsten cathode, the above process is somewhat similar to sputtering which is a physical deposition method. However, in the sputtering, a pressure in the chamber should be very low, and argon (Ar) heavier than hydrogen is used in the sputtering process. Meanwhile, the hydrogen plasma of the present disclosure has very low sputtering efficiency due to light weight, and the pressure in the chamber to which the hydrogen plasma is applied is also set higher than in the sputtering process. Thus, in the present disclosure, the process in the hydrogen plasma contacts the tungsten cathode should not be limited to sputtering.

In the above description, the term "physicochemical interaction of the hydrogen plasma and the tungsten cathode" reflects the above situation. In the present disclosure, the hydrogen plasma plays a role of relaxing and dissolving a chemical bond of the tungsten cathode, particularly the carbonization layer ($WC_x$), and accordingly, it is interpreted as the tungsten atom and the carbon atom of the carbonization layer are diffused in a vapor form onto the NCD film. For reference, the relaxing and dissolving of the chemical bond of the carbonization layer ($WC_x$) is naturally influenced by the temperature (600 to 800° C.) in the chamber.

In addition, the plasma applied in the present disclosure is made of pure hydrogen, and this also makes it possible to supply the tungsten atom and the carbon atom of the carbonization layer. According to another study of the inventor of the present disclosure (H. J. Lee, H. Jeon and W. S. Lee, J. Appl. Phys., 2011, 109, 023303), it has been revealed that a binary alloy is not composed under a mixed gas environment of methane and hydrogen due to the inert property of tungsten. In this consideration, in the present disclosure, it is judged that not only the tungsten atom but also the carbon atom is deviated and moved in the carbonization layer since pure hydrogen plasma without carbon (methane) is used.

Meanwhile, a geometric shape of the tungsten carbide formed on the NCD film is determined depending on the degree of supersaturation on a growth front when the tungsten carbide grows. If the degree of supersaturation is relatively low, the tungsten carbide forms a nanowall structure, and if the degree of supersaturation is relatively high, the tungsten carbide forms a film shape on the NCD.

The degree of supersaturation is determined depending on a flux of growth species (or, a growth species flux) supplied onto the NCD film at the carbonization layer of the tungsten cathode. Therefore, if the growth species flux is relatively high, tungsten carbide in a film form is formed due to high supersaturation, and if the growth species flux is relatively low, tungsten carbide of a nanowall structure is formed due to low supersaturation.

Factors determining the growth species flux include 1) a generation rate of the growth species at the carbonization layer and 2) a diffusion rate of the generated growth species. The factor 1) may be controlled by adjusting a discharge voltage and current applied to the anode and the tungsten cathode, and the factor 2) may be controlled by adjusting a process temperature in the chamber. If the discharge voltage and current is high or the process temperature is high, the growth species flux increases, and resultantly, the growth front forms a high supersaturation state so that tungsten carbide of a film form grows. Meanwhile, if the discharge voltage and current is low or the process temperature is low, the growth species flux decreases, and resultantly, the growth front forms a low supersaturation state so that tungsten carbide of a nanowall form grows.

In a relatively low supersaturation state, the nanowall structure is formed, and in a relatively high supersaturation state, the film structure is formed, due to the following reasons.

In a relatively low supersaturation state, since the growth species flux is low, secondary nucleation on the growth front is minimized during a growth process to vertically grow in a single-crystal form, thereby forming a nanowall structure. Meanwhile, in a relatively high supersaturation state, since the growth species flux is high, secondary nucleation is repeatedly performed on the growth front to disturb vertical growth, thereby inevitably forming a poly-crystal film finally.

In an embodiment, based on the above principle, by adjusting a discharge voltage and a discharge current applied to the anode and the tungsten cathode and/or a process temperature in the chamber, the growth species flux is controlled so that the tungsten carbide nanoflake has a two-dimensional nanostructure such as a nanowall structure.

Next, by means of a cleaning process through a plurality of cycles, the oxide layer or the graphene layer is removed from the surface of the tungsten carbide nanoflake (S2). The oxide layer or the graphene layer is removed by cleaning in order to enhance catalytic activity of the tungsten carbide nanoflake at a hydrogen evolution reaction (HER). This will be described later with reference to experiment results of the inventors.

In addition, the surface of the tungsten carbide nanoflake is partially covered by a protection film to complete the manufacture of a structure for use as an electrode (S3).

Figure 2:
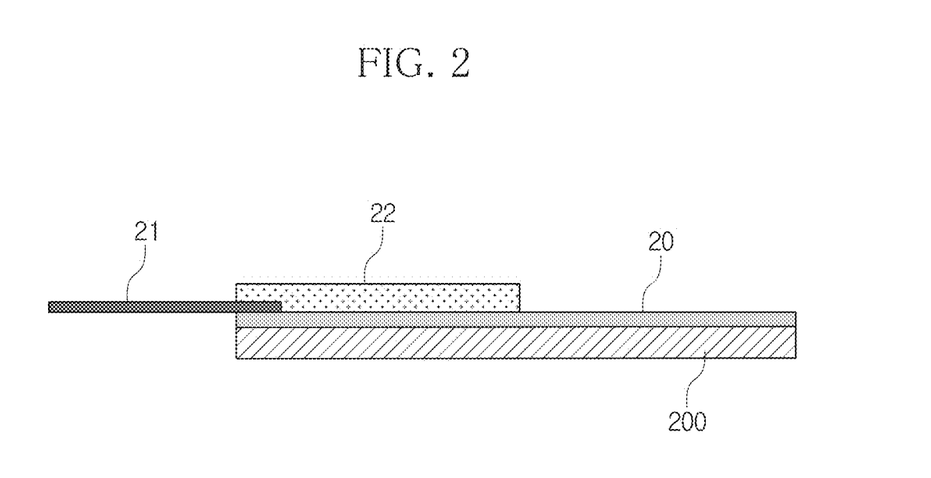
FIG. 2 is a schematic view showing an electrode for hydrogen production using a tungsten carbide nanoflake according to an embodiment.

FIG. 2 is a schematic view showing an electrode for hydrogen production using a tungsten carbide nanoflake according to an embodiment.

Referring to FIG. 2, an electrode body 20 of this embodiment is disposed on a substrate 200. The substrate 200 may be a silicon (Si) substrate, without being limited thereto. The electrode body 20 is electrically connected to a contact portion 21 made of conductive material for the connection to an external power source or a load. Further, the surface of the electrode body 20 may be partially covered by a protection film 21. The electrode body 20 is generated by the process described above with reference to FIG. 1, and includes a NCD film and tungsten carbide of a two-dimensional nanostructure grown from the NCD film. In addition, the surface of the electrode body 20 not covered by the protection film 21 is obtained by removing the oxide layer and/or the graphene layer from the surface of the tungsten carbide by means of the cleaning process described above with reference to S2 of FIG. 1.

Hereinafter, an experimental example of the method for manufacturing an electrode for hydrogen production using a tungsten carbide nanoflake according to the present disclosure, performed by the inventors, and experiment results will be described.

<Formation of a NCD Film on a Silicon Substrate>

A NCD film was composed on a silicon substrate using a hot-filament chemical vapor deposition (HFCVD). Before performing the HFCVD process, the silicon substrate was put into a methanol solution in which NCD particles with an average diameter of 3 nm were dispersed, and ultrasonic treatment was performed thereto to disperse the NCD particles on the substrate. In the HFCVD process, a mixed gas of $CH_4$ 5% and $H_2$ 95% was used as a precursor, and this process was performed for 30 minutes with a substrate temperature of 750° C. and a pressure of 7.5 Torr in the chamber. Through the HFCVD process, a NCD film with a thickness of 440 nm and a particle size of 10 to 15 nm was formed.

<Composing of a Tungsten Carbide Nanoflake>

Tungsten carbide of a nanowall structure was composed on the prepared NCD film using a DC-PACVD device.

An anode was disposed in a chamber of the DC-PACVD device, a tungsten disc serving as a substrate holder is provided on the anode, a substrate having the NCD film was provided on the tungsten disc, and a surface-carburized tungsten cathode is disposed at a location upwardly spaced apart from the substrate by 5 mm. The surface-carburized tungsten cathode was formed in advance by exposing the tungsten cathode to a diamond composing condition ($H_2$-$CH_4$ precursor) using CVD, and a $WC_x$ structure is formed to a predetermined depth from the surface of the surface-carburized tungsten cathode.

The tungsten carbide was composed by applying a first process condition and a second process condition. The first process condition has a discharge voltage of 480V, a discharge current of 50 A, a cathode temperature of 600° C., and a substrate temperature of 600° C., respectively. The second process condition has a discharge voltage of 473V, a discharge current of 50 A, a cathode temperature of 800° C., and a substrate temperature of 800° C., respectively. At both of the first process condition and the second process condition, the chamber pressure was 100 Torr, and the process time was 6 hours. Also, hydrogen of 150 SCCM was supplied into the chamber to generate hydrogen plasma. The hydrogen plasma played a role of moving tungsten atom and carbon atom of the surface-carburized tungsten cathode and the NCD to the growth front of the tungsten carbide.

<Removal of an Oxide Layer and/or a Graphene Layer by Cleaning>

The surface of the tungsten carbide nanoflake composed on the NCD film as described above was treated by means of a cleaning process with several thousand cycles to remove the oxide layer and/or the graphene layer on the tungsten carbide nanoflake, and HER activity was increased to enhance the usage as a hydrogen-generating electrode. For the cleaning, 0.5 M sulfuric acid solution was used. Here, a voltage was applied to the tungsten carbide nanoflake immersed in the sulfuric acid solution, and the applied voltage was changed from −0.3 V to 0 V and then from 0 V to −0.3 V, which corresponds to one cycle. In the cleaning process, 4000 cycles were performed. At each cycle, a voltage change rate was 10 mV/s. However, the cleaning process may also be performed in a different way, and the cleaning solution, the voltage range and the voltage moving rate are not limited to the above.

Figure 3:
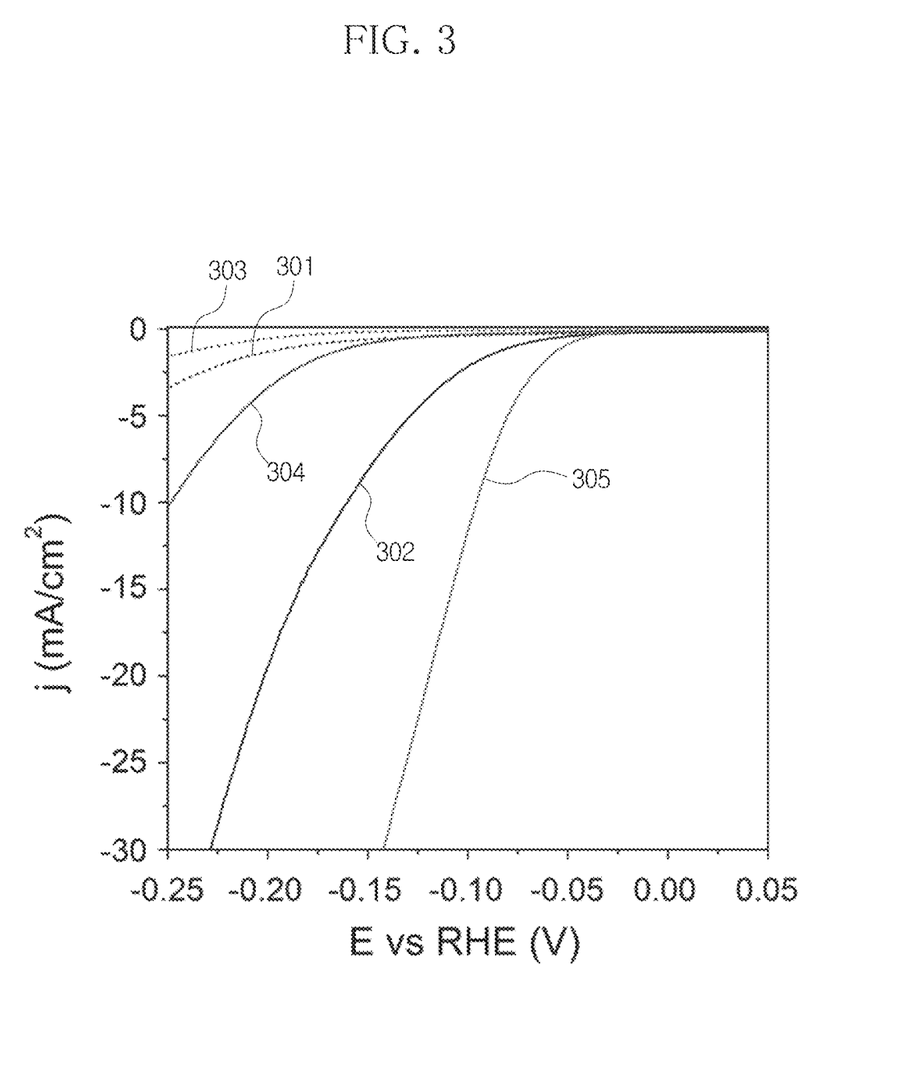
FIG. 3 is a graph comparatively showing linear sweep voltammetry (LSV) curves of the tungsten carbide nanoflake composed according to embodiments and a platinum (Pt) electrode.

FIG. 3 is a graph comparatively showing linear sweep voltammetry (LSV) curves of the tungsten carbide nanoflake composed according to embodiments and a platinum (Pt) electrode, in which an ohmic potential drop in comparison to a difference of an electrode potential (E) and a real hydrogen electrode (RHE) potential is exhibited. Graphs 301 and 302 and respectively represent LSV curves of a nanowall structure before and after cleaning. Graphs 303 and 304 and respectively represent LSV curves of a nanocrystal structure before and after cleaning. Graph 305 represents the LSV curve of a platinum. Here, the increase of HER activity after cyclically cleanings as much as 4000 cycles is shown. Even though the activity increases by means of cleaning in both the nanowall structure and the nanocrystalline structure, the activity particularly increases greatly in the nanowall structure. The above results are shown in Table 1 below.

TABLE 1

| Material | onset (Onset) potential (V) | overpotential @ 10 mA/cm$^2$ (mV) | current density @ 0.25 V (mA/cm$^2$) |
|---|---|---|---|
| WC nanocrystalline | −0.102 | 248 | −10.31 |
| WC nanowall | −0.052 | 160 | −40.10 |
| platinum (Pt) | −0.005 | 95 | −83.85 |

Figure 4A:
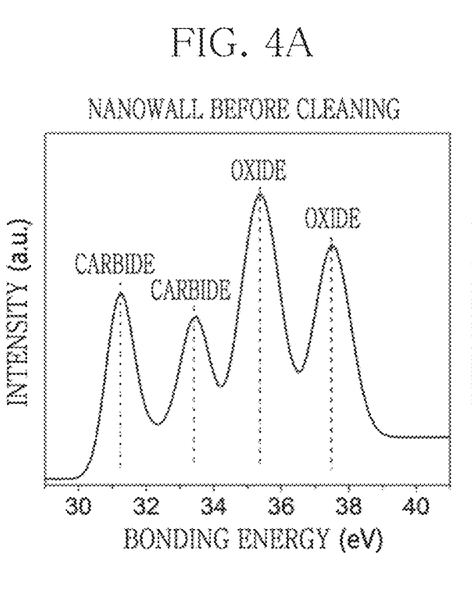
FIGS. 4A to 4D show an X-ray photoelectron spectroscopy (XPS) spectrum of a tungsten carbide nanoflake composed according to embodiments.
Figure 4B:
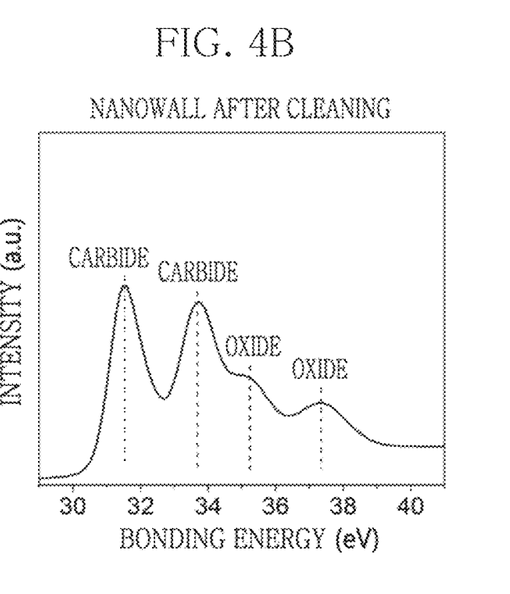
Figure 4C:
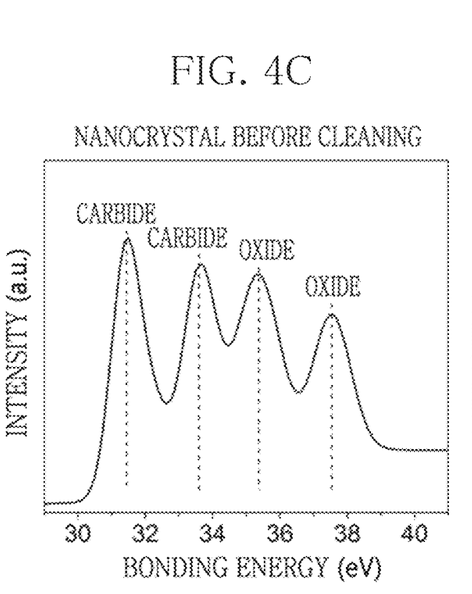
Figure 4D:
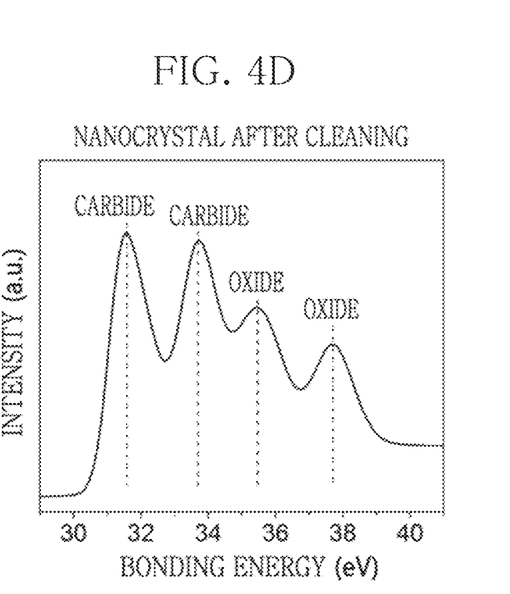

The nanowall sample was excellent in onset potential and current density. As described above, the difference in HER reaction may be found through X-ray photoelectron spectroscopy. FIGS. 4A to 4D show an X-ray photoelectron spectroscopy (XPS) spectrum of a tungsten carbide nanoflake composed according to embodiments. Here, FIG. 4A shows tungsten carbide of a nanowall structure before cleaning, FIG. 4B shows tungsten carbide of a nanowall structure after cleaning, FIG. 4C shows tungsten carbide of a nanocrystalline structure before cleaning, and FIG. 4D shows tungsten carbide of a nanocrystalline structure after cleaning.

As shown in FIGS. 4A and 4B, it may be found that an oxide peak is present at the surface of the initially composed tungsten carbide nanoflake with a greater intensity in comparison to a carbide peak, but after cleaning, the oxide peak decreases greatly and the carbide peak remains as it was.

Meanwhile, in an embodiment of the present disclosure, by means of cleaning, not only oxide but also the amount of a graphene layer (or, a graphitic carbon layer) present at the surface of tungsten carbide is reduced. The graphene layer present at the surface of tungsten carbide is known as giving a bad influence on electrochemical activity.

Figure 5A:
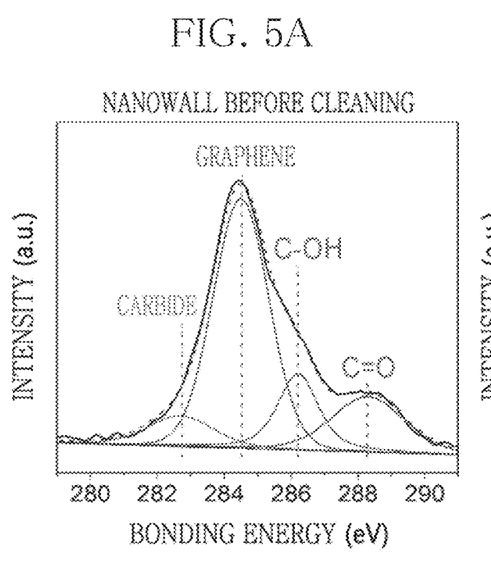
FIGS. 5A to 5D show an XPS spectrum of a tungsten carbide nanoflake composed according to other embodiments.
Figure 5B:
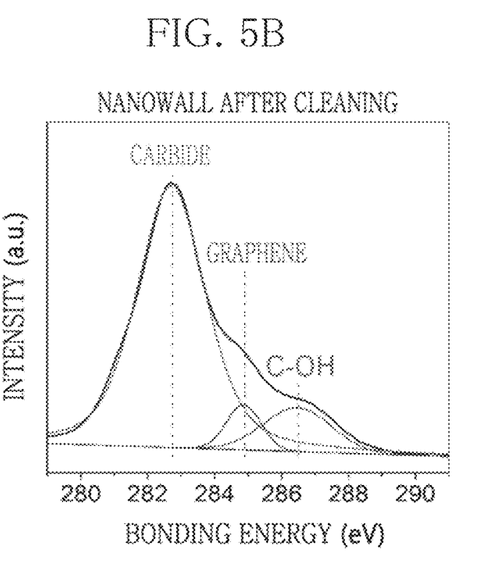
Figure 5C:
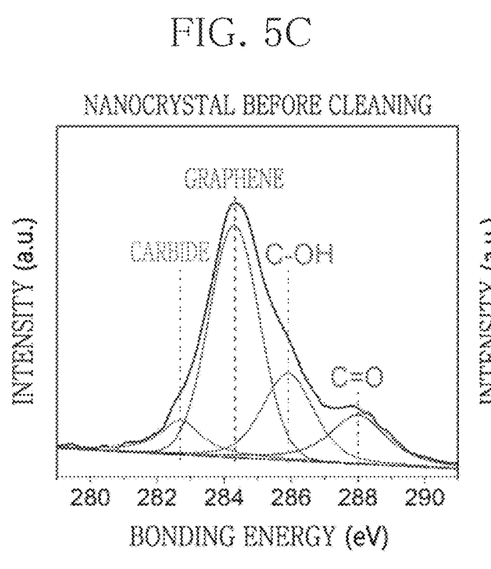
Figure 5D:
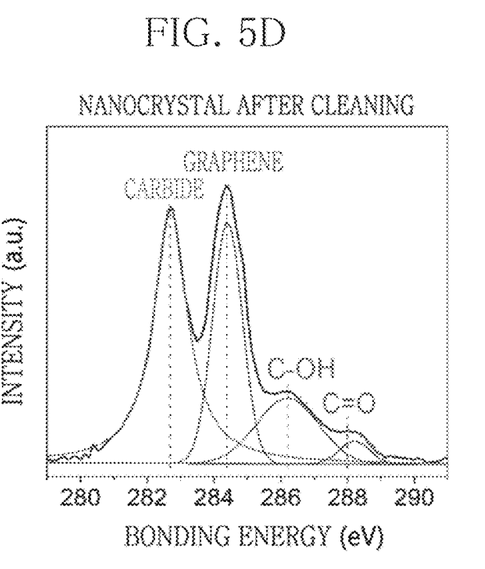

FIGS. 5A to 5D show an XPS spectrum of a tungsten carbide nanoflake composed according to other embodiments. Here, FIG. 5A shows tungsten carbide of a nanowall structure before cleaning, FIG. 5B shows tungsten carbide of a nanowall structure after cleaning, FIG. 5C shows tungsten carbide of a nanocrystalline structure before cleaning, and FIG. 5D shows tungsten carbide of a nanocrystalline structure after cleaning.

As shown in FIGS. 5A to 5D, it is found that the intensity of a peak corresponding to the graphene layer is significantly reduced after the tungsten carbide nanoflake is cleaned. In other words, in embodiments of the present disclosure, the cleaning process plays a role of removing the oxide and graphene layers from the surface of the tungsten carbide nanoflake, and thus it is found that the activity of the tungsten carbide nanoflake is increased as the carbide is exposed as above.

Figure 6:
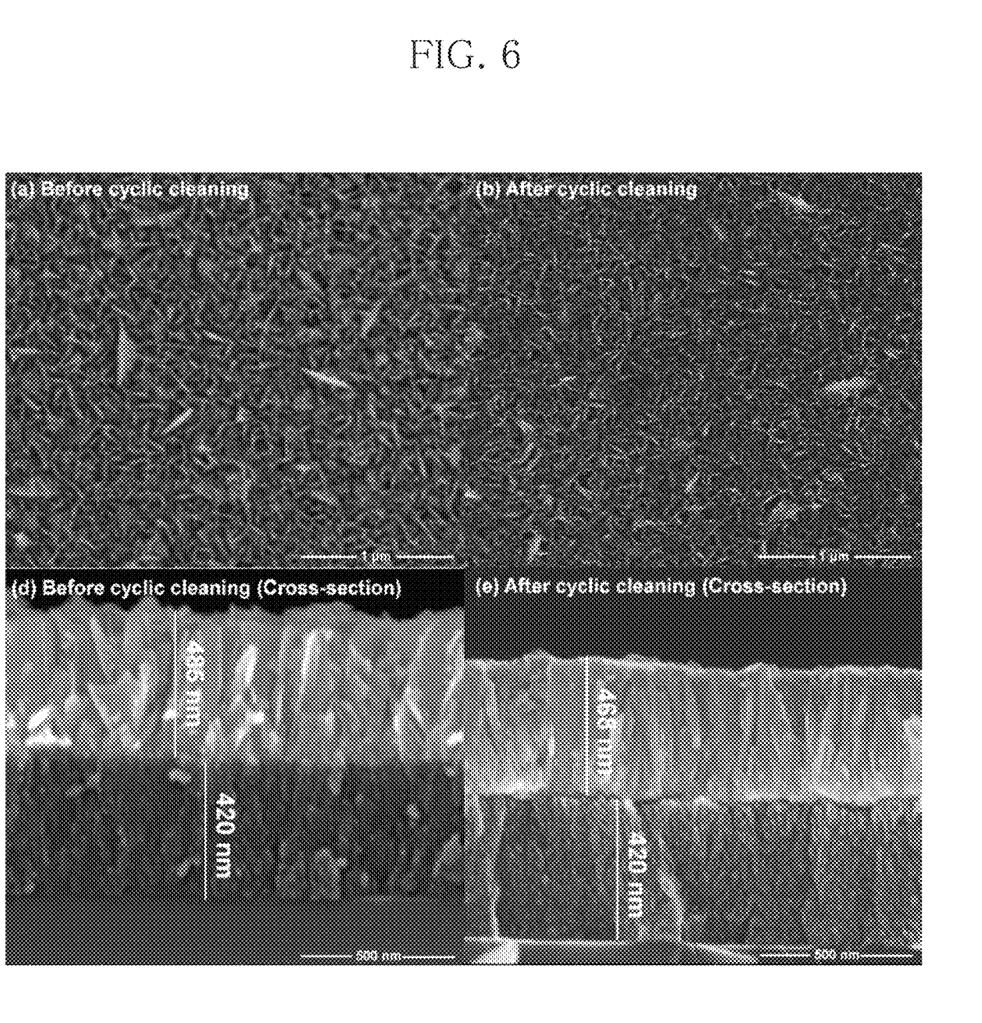
FIG. 6 shows a scanning electron microscope (SEM) image of a tungsten carbide nanowall film composed according to an embodiment.

FIG. 6 shows a scanning electron microscope (SEM) image of a tungsten carbide nanowall film composed according to an embodiment. Here, FIG. 6(A) is a planar image before cyclic cleaning, FIG. 6(B) is a planar image after cyclic cleaning, and FIGS. 6(C) and 6(D) are sectional images corresponding to FIGS. 6(A) and 6(B), respectively.

The increase of HER activity at the tungsten carbide nanoflake is caused by removal of the oxide and carbon layers, and it may be regarded as being caused by dissolution of sulfuric acid at the initial cyclic cleaning stage. FIG. 6 shows such a change, and it is found in FIGS. 6(A) and 6(B) that the oxide layer and the graphene layer are removed from the surface of the tungsten carbide nanoflake by means of the cyclic cleaning process to reduce flakes, respectively, and it is also be found in the sectional images of FIGS. 6(C) and 6(D) that the surface thickness is reduced.

Figure 7A:
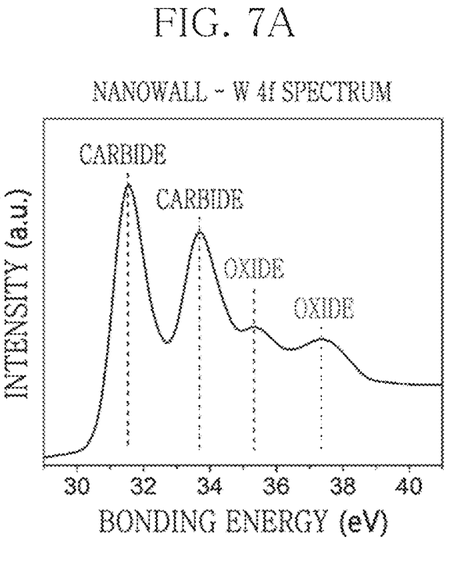
FIGS. 7A to 7D show an XPS spectrum of a tungsten carbide nanoflake composed according to other embodiments.
Figure 7B:
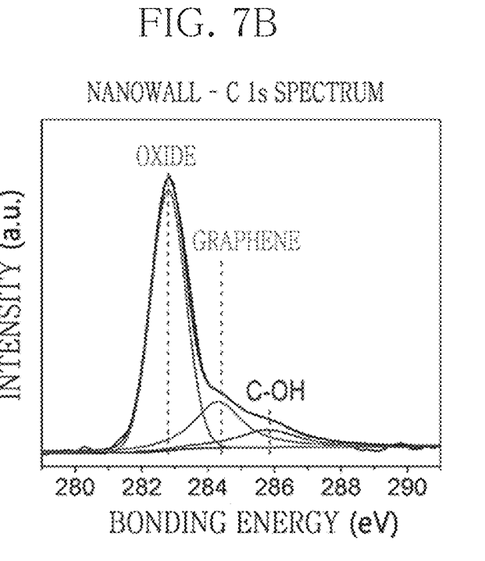
Figure 7C:
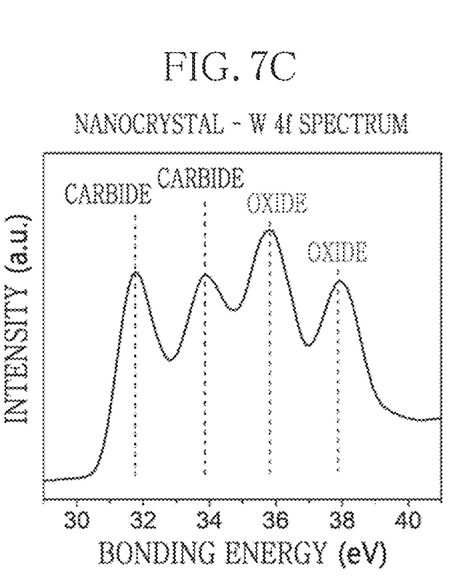
Figure 7D:
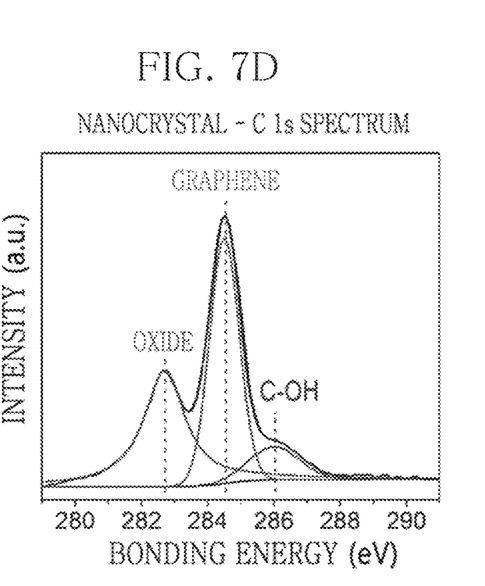
Figure 8A:
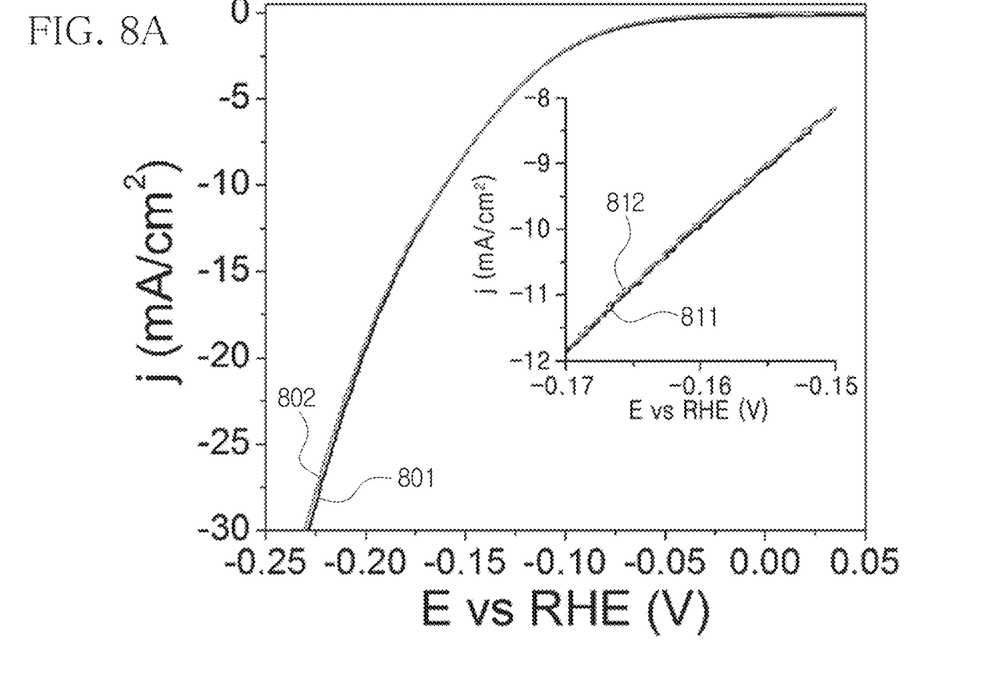
FIGS. 8A and 8B is a graph showing polarization curves before and after a durability test of the tungsten carbide nanoflake according to the embodiments of FIG. 7.
Figure 8B:
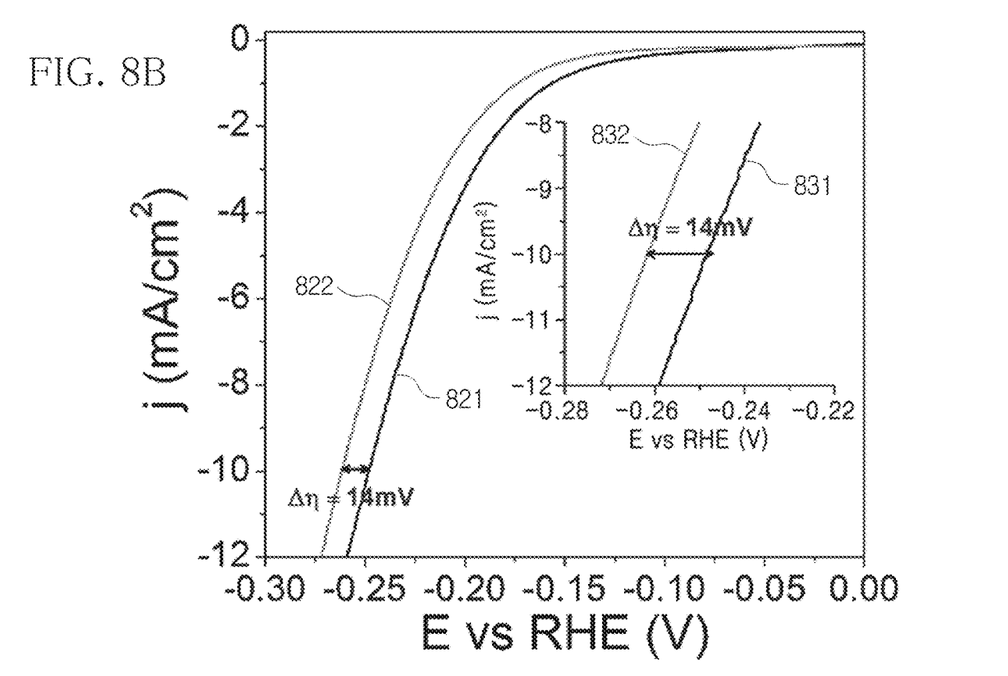

FIGS. 7A to 7D shows an XPS spectrum of a tungsten carbide nanoflake composed according to other embodiments, and FIGS. 8A and 8B is a graph showing polarization curves according to the embodiments of FIGS. 7A to 7D. In particular, FIG. 8A shows polarization curves 801, 811, 821, 831 obtained after the initial cyclic cleaning and polarization curves 802, 812, 822, 832 obtained after performing the cyclic cleaning as much as 10,000 cycles for the stability test, respectively. FIGS. 7A and 7B show results of the nanowall structure, and FIGS. 7C and 7D show results of the nanocrystalline structure. Also, FIG. 8A shows a result of the nanowall structure, and FIG. 8B shows a result of the nanocrystalline structure.

Referring to FIG. 7A to FIG. 8B, in the nanocrystalline structure, degradation is severe, for example overpotential changes by 14 mV at a current density of 10 mA/cm$^2$ as shown in FIG. 8B, but in the nanowall structure, it may be found that activity is not seriously changed at the stability test where the cleaning cycles are extremely increased. The nanowall structure has high stability as described above because the nanowall structure has a small change in the intensity of oxide peak after the initial cyclic cleaning (FIG. 7A and FIG. 4B), but the nanocrystalline structure has a great difference in the oxide peak (FIG. 7C and FIG. 4D). In both structures, the graphene peaks are similar (if FIG. 5B and FIG. 7B are compared with FIG. 5D and FIG. 7D), and thus, the high durability of the nanowall structure is regarded as being caused by high resistance against oxidation in the HER environment.

Figure 9:
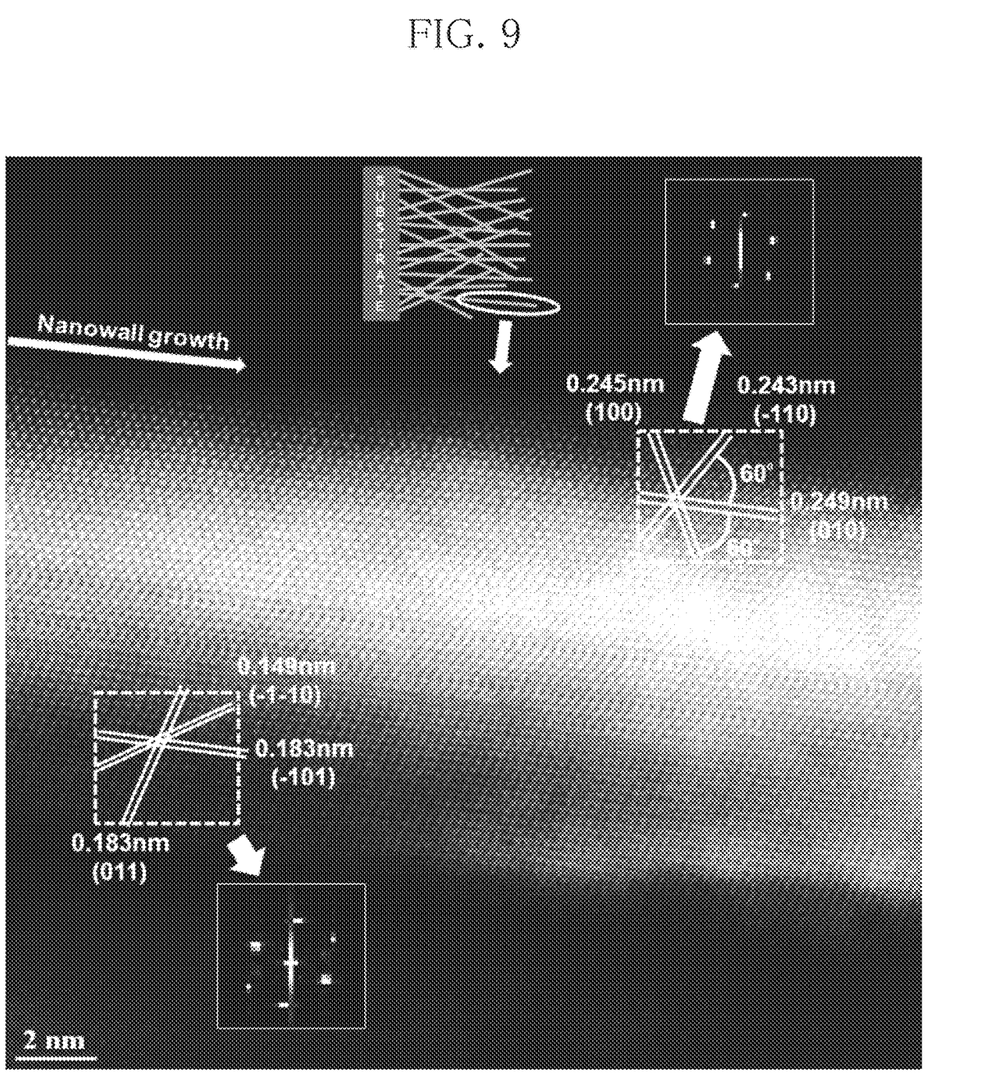
FIG. 9 is a high-resolution transmission electron microscope (HR-TEM) image of a tungsten carbide nanowall composed according to an embodiment, after cleaning.

FIG. 9 is a high-resolution transmission electron microscope (HR-TEM) image of a tungsten carbide nanowall composed according to an embodiment, after cleaning.

It is known that the high oxidation resistance of tungsten carbide is improved by means of crystalline perfection, as shown in the HR-TEM image of FIG. 9. Referring to FIG. 9, it may be found that, after cleaning, there is no unordered grain boundary at the surface of the tungsten carbide having a nanowall structure, and also the nanowall surface extends from the inside so that the {001} crystal face is arranged substantially in parallel to the nanowall surface to have high crystallinity. Meanwhile, in the nanocrystalline structure, the grain boundary is relatively not ordered, and thus it is known that, if the cleaning cycle is elongated, the nanocrystalline structure is more likely to be oxidized in comparison to the nanowall structure.

Figure 10A:
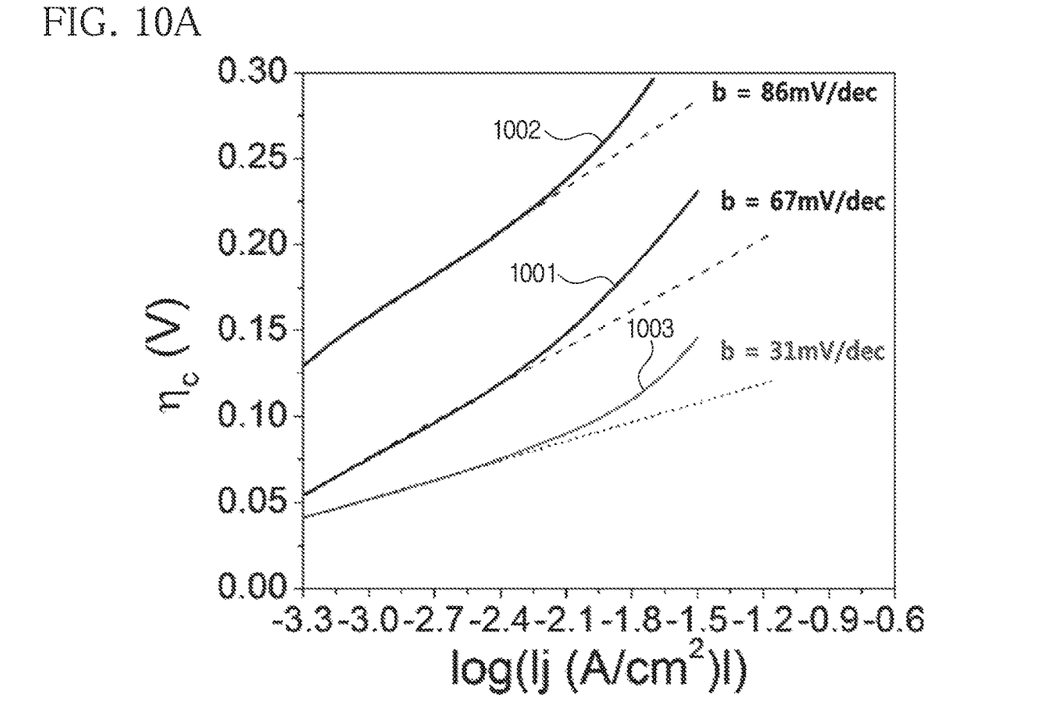
FIGS. 10A and 10B show a Tafel plot and a turnover frequency (TOF) of a tungsten carbide nanoflake composed according to embodiments.
Figure 10B:
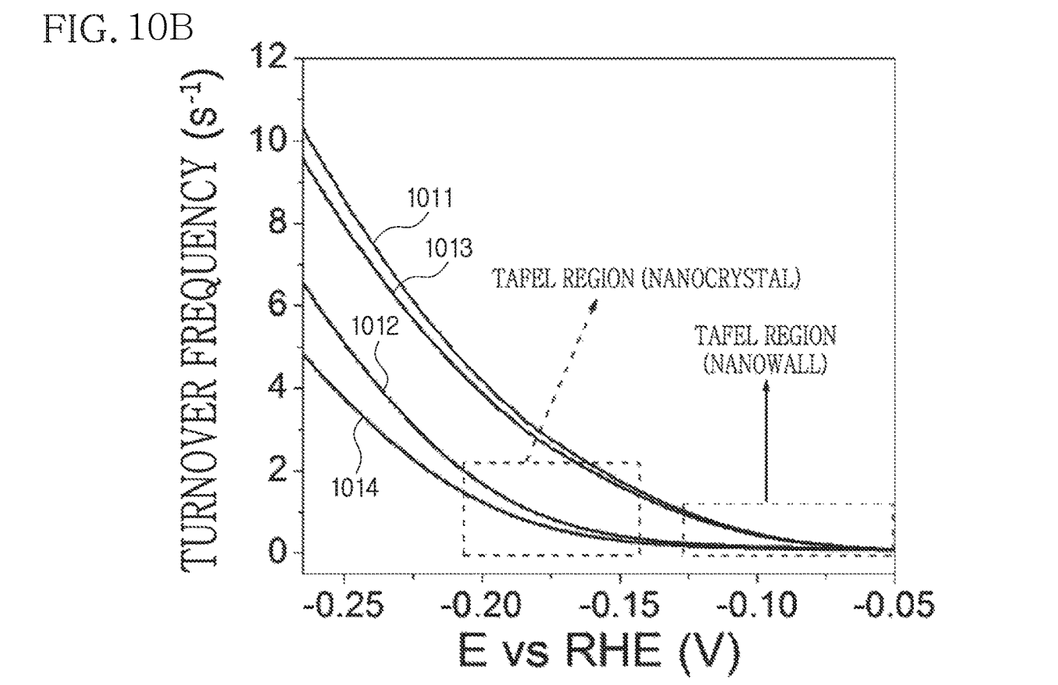

FIGS. 10A to 10B shows a Tafel plot and a turnover frequency (TOF) of a tungsten carbide nanoflake composed according to embodiments.

The result depicted in FIGS. 10A and 10B is obtained by more quantitatively analyzing HER activity of the tungsten carbide nanoflake. Here, FIG. 10A shows Tafel plots 1001, 1002 and 1003 of a WC nanowall structure, a WC nanocrystal structure and a platinum, respectively, and a Tafel slope calculated therefrom. FIG. 10B shows a TOF calculated from the result of FIG. 10A. Graphs 1011 and 1012 respectively represent the TOF of a WC nanowall structure and a WC nanocrystal structure, calculated from cyclic voltammetry (CV) curve. Further, Graphs 1013 and 1014 respectively represent the TOF of a WC nanowall structure and a WC nanocrystal structure, calculated from observation results using a atomic force microscope (AFM). The Tafel slope represents an amount of overvoltage required for generating a unit current density, and the current density means a reacting amount. If the Tafel slope is great, this means that a voltage should be further applied to make the same reacting amount, and thus this means that the HER activity is bad. In addition, since the TOF means an amount of hydrogen molecules produced per second, and thus as the TOF is greater, the HER activity is more excellent.

As shown in the figures, it is found that the catalytic activity of the tungsten carbide nanoflake composed according to the embodiments, which is represented by the Tafel slope in FIG. 10A and the TOF in FIG. 10B, is greatly excellent in comparison to other electrode materials known in the art. In particular, the tungsten carbide of a nanowall structure is most excellent in onset potential and has no overpotential degradation after a lot of cycles.

The comparison results of catalytic activity between the tungsten carbide nanoflake according to the embodiments and other various materials are shown in Table 2 below.

TABLE 2

| material | Tafel slope (mV/dec) | onset potential (V) | stability | | |
|---|---|---|---|---|---|
| | | | solution | potential range | cycle | overpotential changed |
| Fe—WCN nanoparticle | 47.1 | −0.1 | pH 1 $H_2SO_4$ | −0.3 to 0.5 V | 3000 | none |
| WC nanoparticle/ carbon black | — | — | 0.5M $H_2SO_4$ | −0.3 to 0.6 V | 3000 | 10 mV increased |
| WC nanoparticle/ carbon nanotube (CNT) | 122 | — | pH 1 $H_2SO_4$ | — | 1000 | none |
| WCN nanoparticle (nanocrystal) | 65 | — | 0.1M $HClO_4$ | −0.5 to 0.3 V | 10000 | 19 mV increased |
| WC nanoparticle | 84 | −0.1 | 0.5M $H_2SO_4$ | −0.3 to 0.1 V | 800 | none |
| $W_2C$ microsphere | 118 | −0.05 | — | — | — | — |
| common WC powder | 73 | −0.1 | — | — | — | — |
| WC nanocrystalline | 83 | −0.102 | 0.5M $H_2SO_4$ | −0.5 to 0.2 V | 10000 | 14 mV increased |
| WC nanowall | 67 | −0.052 | 0.5M $H_2SO_4$ | −0.5 to 0.2 V | 10000 | none |

Using the method for manufacturing an electrode for hydrogen production using a tungsten carbide nanoflake according to an embodiment, since an oxide layer and/or a graphene layer of a surface of tungsten carbide is removed by means of cyclic cleaning after tungsten carbide is formed, hydrogen evolution reaction (HER) activity of the tungsten carbide may be increased, thereby enhancing utilization as a catalyst electrode.

In addition, using the method for manufacturing an electrode for hydrogen production according to an embodiment, tungsten carbide of a two-dimensional nanostructure may be obtained by combining a hydrogen plasma applying process and a chemical vapor deposition process, and the degree of supersaturation on a growth front may be adjusted to selectively change a geometric shape of the tungsten carbide. Therefore, it is possible to manufacture tungsten carbide of a nanowall or nanocrystalline structure, which may be applied to various technical fields.

The present disclosure can be changed and modified in various ways within the scope of the present disclosure by those having ordinary skill in the art and thus is not limited to the above embodiments and the accompanying drawings.

What is claimed is:

1. A method for manufacturing an electrode for hydrogen production using a tungsten carbide nanoflake, comprising:
    forming a tungsten carbide nanoflake on a nanocrystalline diamond film by means of a chemical vapor deposition process in which hydrogen plasma is applied; and
    increasing activity of the tungsten carbide nanoflake to a hydrogen evolution reaction by removing an oxide layer or a graphene layer from a surface of the tungsten carbide nanoflake, wherein removing the oxide layer or the graphene layer from the surface of the tungsten carbide nanoflake comprises reducing a thickness of the oxide layer or the graphene layer by immersing the tungsten carbide nanoflake in a cleaning solution, applying a voltage to the tungsten carbide nanoflake immersed in the cleaning solution, and performing a plurality of cycles, each cycle comprising changing the applied voltage.

2. The method for manufacturing an electrode for hydrogen production using a tungsten carbide nanoflake according to claim 1, wherein in the chemical vapor deposition process in which hydrogen plasma is applied, in a state where a substrate having a nanocrystalline diamond film is provided on an anode in a chamber and a surface-carburized tungsten cathode is provided at a location upwardly spaced apart from the substrate, hydrogen plasma is applied into the chamber.

3. The method for manufacturing an electrode for hydrogen production using a tungsten carbide nanoflake according to claim 1, wherein the step of forming a tungsten carbide nanoflake includes controlling the degree of supersaturation at a growth front of tungsten carbide so that the tungsten carbide grows to have a nanowall structure.

4. The method for manufacturing an electrode for hydrogen production using a tungsten carbide nanoflake according to claim 3, wherein the step of controlling the degree of supersaturation at a growth front of tungsten carbide includes controlling a flux of growth species by adjusting a process temperature of the chemical vapor deposition process in which hydrogen plasma is applied.

5. The method for manufacturing an electrode for hydrogen production using a tungsten carbide nanoflake according to claim 3, wherein the step of controlling the degree of supersaturation at a growth front of tungsten carbide includes controlling a flux of growth species by adjusting a discharge voltage and current which is applied for generating hydrogen plasma in the chemical vapor deposition process in which hydrogen plasma is applied.

6. The method for manufacturing an electrode for hydrogen production using a tungsten carbide nanoflake according to claim 2, wherein the surface-carburized tungsten cathode has a carbonization layer formed to a predetermined depth from the surface of the tungsten carbide nanoflake by exposing the tungsten cathode to a carbon environment of a predetermined temperature, and the carbonization layer forms a $WC_x$ structure.

7. The method for manufacturing an electrode for hydrogen production using a tungsten carbide nanoflake according to claim 1, after the increasing activity of the tungsten carbide nanoflake to a hydrogen evolution reaction, further comprising: forming a protection film to partially cover the surface of the tungsten carbide nanoflake.

* * * * *